United States Patent
Lin et al.

(10) Patent No.: US 6,204,559 B1
(45) Date of Patent: Mar. 20, 2001

(54) BALL GRID ASSEMBLY TYPE SEMICONDUCTOR PACKAGE HAVING IMPROVED CHIP EDGE SUPPORT TO PREVENT CHIP CRACKING

(75) Inventors: Chun Hung Lin, Kaohsiung; Yire Zine Lee, Kaohsiung Hsien; Su Tao; Jian Wen Chen, both of Kaohsiung, all of (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/444,365

(22) Filed: Nov. 22, 1999

(51) Int. Cl.$^7$ .............................. H01L 23/52; H01L 23/48
(52) U.S. Cl. .......................... 257/738; 257/737; 257/778; 257/780; 257/693; 257/692; 257/774; 257/691; 361/774; 361/777; 174/260; 174/261
(58) Field of Search .................................. 267/738, 737, 267/777–780, 774, 734, 696, 692, 693; 361/774, 777; 174/260, 261

(56) References Cited

U.S. PATENT DOCUMENTS

| | | | |
|---|---|---|---|
| 5,581,122 | * 12/1996 | Chao et al. | 257/738 |
| 5,640,047 | * 6/1997 | Nakeshima | 257/738 |
| 5,640,048 | * 6/1997 | Selna | 257/738 |
| 5,796,589 | * 8/1998 | Barrow | 257/738 |
| 5,874,784 | * 2/1999 | Aoki et al. | 257/737 |
| 5,909,054 | * 6/1999 | Kozono | 257/738 |
| 5,945,741 | 8/1999 | Ohsawa et al. | 257/777 |
| 5,959,356 | * 9/1999 | Oh | 257/738 |
| 5,962,917 | * 10/1999 | Moriyama | 257/697 |

* cited by examiner

Primary Examiner—Alexander O. Williams

(57) ABSTRACT

This invention moves at least one outer via outwardly to a location under the edge of the chip so as to form an offset via. Since the via is made of copper, the offset via provides sufficient supporting strength for the chip edge during molding process. Further, this invention also disposes a copper mesh on the substrate at the area without vias and traces so as to enhance the substrate strength for supporting the chip. According to another aspect of this invention, dummy via holes are provided for the substrate at the area under the chip edge for supporting the chip. Since the copper mesh, offset via, the dummy via hole are made of copper having sufficient supporting strength for the chip, the crack problem during molding process can be eliminated.

10 Claims, 3 Drawing Sheets

BALL GRID ASSEMBLY TYPE SEMICONDUCTOR PACKAGE HAVING IMPROVED CHIP EDGE SUPPORT TO PREVENT CHIP CRACKING

BACKGROUND OF THE INVENTION

1. Field of the Invention

This invention generally relates to a semiconductor package, and more particularly to a chip sized package (CSP) with an improved thin substrate for eliminating a die crack problem.

2. Description of the Related Art

As the need for lighter and more complicated semiconductor devices becomes greater semiconductor chips have become more and more complex thereby requiring more electrical connections. Therefore, the ball grid array (BGA) has been developed by the semiconductor chip packaging industry to meet these needs.

FIG. 1 depicts a conventional BGA semiconductor chip package 100 including a chip 101 attached on a substrate 102 having a dielectric layer 102a. The chip pads on the active surface of the chip 101 are connected to conductive traces 102c disposed on the upper surface 102b of the dielectric layer 102a by bonding wires 103 and the conductive traces 102c are electrically connected through the plated through holes (PTH) 107 to the solder ball pads 102f disposed on the lower surface 102d of the dielectric layer 102a. Each solder ball pads 102f has a solder ball 104 mounted thereon for electrical connection to outer circuit, such as a printed circuit board. A package body 105 encapsulates the chip 101, bonding wires 103 and the substrate 102.

The dielectric layer 102a of the substrate 102 is generally made of fiberglass reinforced bismaleimide-triazine (BT) resin, FR-4 fiberglass reinforced BT epoxy resin or polyimide and the thickness of the substrate 102 is about 0.56 mm. A copper die pad 108 is disposed on the central surface of the substrate 102 for carrying the chip 101. The plated through holes (vias) 107 are arranged around the die pad 108.

However, the overall volume of the above BGA semiconductor chip package 100 is too large to meet the packaging requirements for high density semiconductor chip. Accordingly, the packaging industry further develops a chip sized package (CSP) technology to meet the packaging requirements for high density semiconductor chip. Generally, the overall dimension of the chip sized package is smaller than 1.2 times of the chip dimension so as to increase the packaging density.

FIG. 2 illustrates a conventional CSP semiconductor chip package 200 including a chip 201 attached on a substrate 202 having a dielectric layer 202a. The chip pads on the active surface of the chip 201 are connected to conductive traces 202c disposed on the upper surface 202b of the dielectric layer 202a by bonding wires 203 and the conductive traces 202c are electrically connected through the plated through holes (PTH) 207 to the solder ball pads 202f disposed on the lower surface 202d of the dielectric layer 202a. Each solder ball pads 202f has a solder ball 204 mounted thereon for electrical connection to outer circuit, such as a printed circuit board. A package body 205 encapsulates the chip 201, bonding wires 203 and the substrate 202. According to the CSP semiconductor chip package 200, the area surrounded by the solder balls is usually smaller than the area of the chip 201.

According to the CSP semiconductor chip package 200 as shown in FIG. 2, the thickness of the substrate 202 is about 0.36 mm or less than 0.36 mm and the plated through holes (vias) 207 of the substrate 202 are arranged within the periphery of the chip 201. At room temperature, the Storage Modulus (E') of the fiberglass reinforced bismaleimide-triazine (BT) resin for the substrate is about 7,000–9,000 MPa, while the Young's Modulus (E) of copper for the plated through holes (vias) 207 is about 110,000 MPa. During resin molding (about 175° C.), the Storage Modulus (E') of the BT substrate is about 2,000–3,000 MPa, while the Young's Modulus (E) of copper for the plated through holes (vias) 207 is about 103,000 MPa. Therefore, during resin molding (about 175° C.), the ratio of the copper's Young's Modulus (E) to the BT's Storage Modulus (E') increases from 15 to 500 such that the BT substrate 202 without vias 207 is relatively softer than the BT substrate 202 with vias 207 and the area of BT substrate 202 without vias 207 is unable to provide sufficient strength for supporting chip 201. Besides, since the chip 201 is not supported by the die pad, in the CSP package, stress caused by molding pressure will exert on the edge 201a of the chip 201 and the chip will crack at the edge 201a area. This will lower the yield for production.

Accordingly, there is a need for the packaging industry for eliminating the die crack problem for the chip sized package.

SUMMARY OF THE INVENTION

It is a primary object of the present invention to provide a semiconductor package with an improved thin substrate in which the thin substrate is provided with an improved via hole arrangement for supporting the chip to eliminate the crack during molding process.

It is a secondary object of the present invention to provide a. a semiconductor package with an improved thin substrate in which the thin substrate is provided with a copper mesh for supporting the chip to eliminate the crack during molding process.

It is another object of the present invention to provide a semiconductor package with an improved thin substrate in which the thin substrate is provided with dummy via holes at the area under the chip edge for supporting the chip to eliminate the crack during molding process.

To achieve the above objects, the present invention shortens the length of outer traces on the substrate to move at least one outer via outwardly to a location under the edge of the chip so as to form an offset via. Since the via is made of copper, the offset via might provide sufficient supporting strength for the chip edge during molding process such that the die crack problem is eliminated. Further, the present invention also disposes a copper mesh on the substrate at the area without vias and traces so as to enhance the substrate strength for supporting the chip. When the chip is mounted on the substrate, the copper mesh lies under the edges of the chip for supporting the chip during molding process such that the die crack problem is eliminated.

According to another aspect of the present invention, dummy via holes are provided for the substrate at the area under the chip edge for supporting the chip. Since the dummy via holes are made of copper having sufficient supporting strength for the chip, the crack problem during molding process can be eliminated.

DETAILED DESCRIPTION OF THE PREFERRED EMBODIMENT

Figure 5:
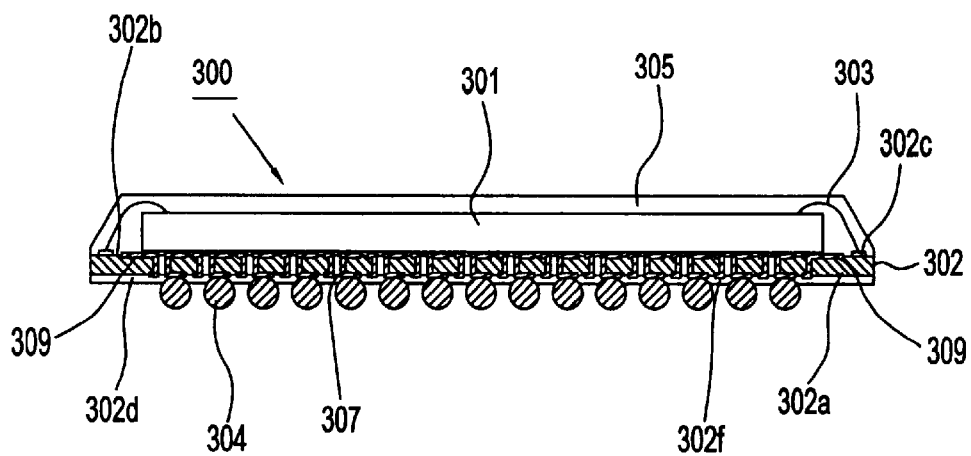
FIG. 5 is a cross sectional view of a semiconductor chip package in accordance with the present invention.

Referring to FIG. 5 first, it shows a cross sectional view of a semiconductor chip package in accordance with the present invention. The semiconductor chip package 300 includes a chip 301 attached on a substrate 302 having a dielectric layer 302a. The chip pads on the active surface of the chip 301 are connected to bonding pads 302c disposed on the upper surface 302b of the dielectric layer 302a by bonding wires 303 and the bonding pads 302c are electrically connected through the plated through holes (via) 307 to the solder ball pads 302f disposed on the lower surface 302d of the dielectric layer 302a. Each solder ball pads 302f has a solder ball 304 mounted thereon for electrical connection to outer circuit, such as a printed circuit board. A package body 305 encapsulates the chip 301, bonding wires 303 and the substrate 302. According to the semiconductor chip package 300, the area surrounded by the solder balls is usually smaller than the area of the chip 301.

The dielectric layer 302a of the substrate 302 is generally made of fiberglass reinforced bismaleimide-triazine (BT) resin, FR-4 fiberglass reinforced BT epoxy resin or polyimide. Vias 307 are formed on the dielectric layer 302a of the substrate 302 by mechanical drilling or laser ablation and are plated with a metal layer, such as copper. Further, the present invention also disposes a copper mesh 308 on the substrate 302 at the area without vias 307 and traces 309 so as to enhance the substrate strength for supporting the chip 301. When the chip 301 is mounted on the substrate 302, the copper mesh 308 lies under the edges 301a of the chip 301 for supporting the chip 301.

Figure 1:
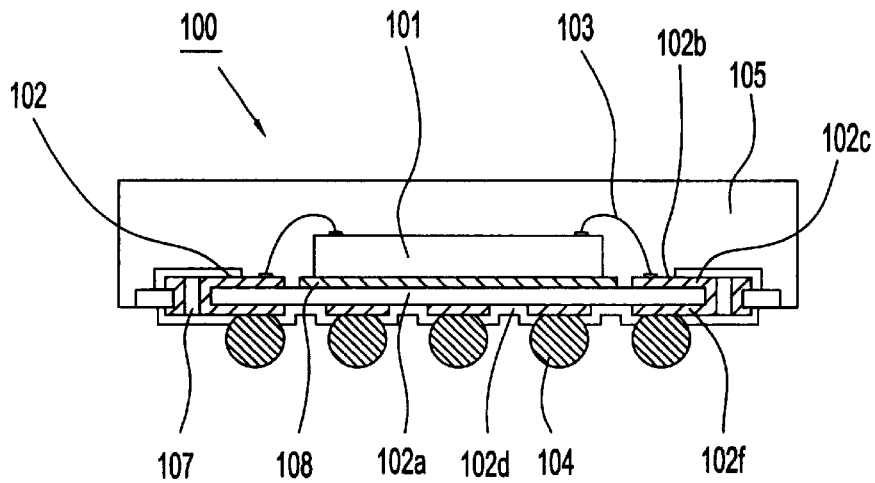
FIG. 1 is a cross sectional view of a conventional BGA semiconductor chip package.
Figure 2:
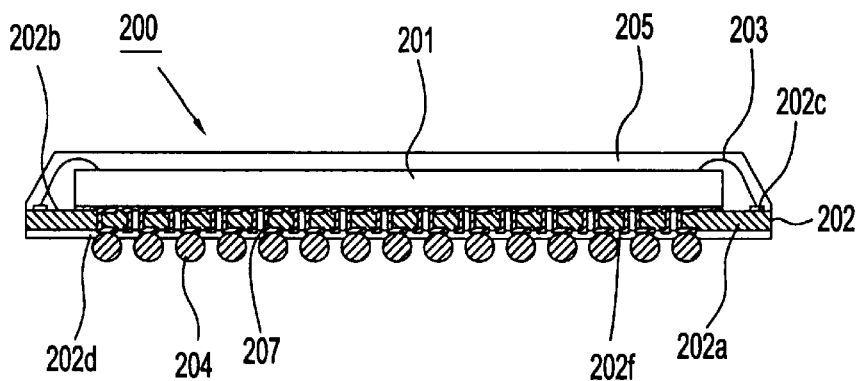
FIG. 2 is a cross sectional view of a conventional CSP semiconductor chip package.
Figure 3:
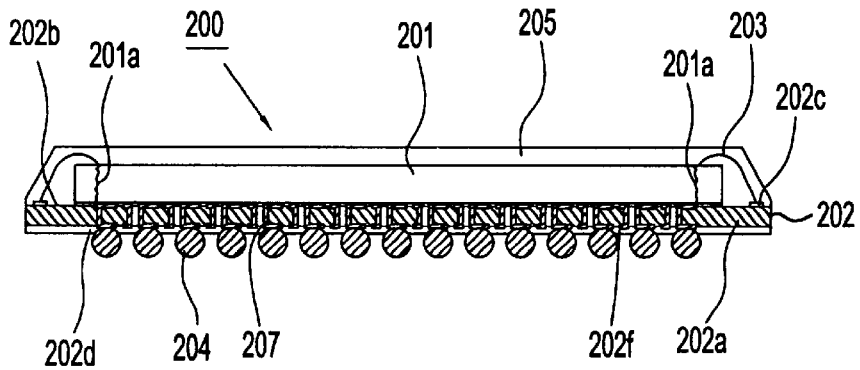
FIG. 3 is a cross sectional view of a conventional CSP semiconductor chip package, wherein a crack occurs at the edge of the chip.
Figure 4:
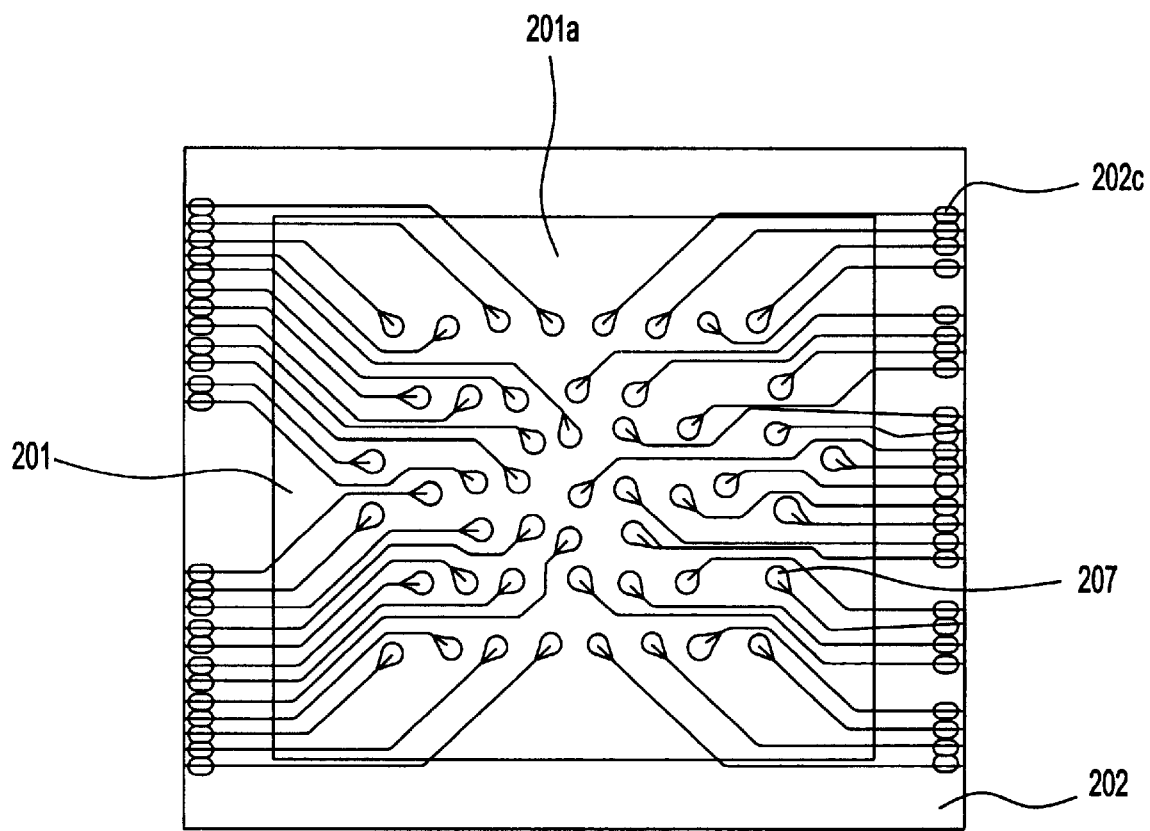
FIG. 4 is a top plan view of the conventional substrate.

As shown in FIG. 4, the vias 207of the conventional CSP package locate under the central area of the chip 201 in the substrate and the edges 201 a of the chip 201 extend outside the area surrounded by the outer vias 207 which are arranged in line. As mentioned above, during resin molding (about 175° C.), the Storage Modulus (E') of the BT substrate is about 2,000–3,000 MPa, while the Young's Modulus (E) of copper for the plated through holes (vias) 207 is about 103,000 MPa. Therefore, during resin molding (about 175° C.), the ratio of the copper's Young's Modulus (E) to the BT's Storage Modulus (E') increases from 15 to 500 such that the BT substrate 202 without vias 207 is relatively softer than the BT substrate 202 with vias 207 and the area of BT substrate 202 without vias 207 is unable to provide sufficient strength for supporting chip 201. Besides, since the chip 201 is not supported by the die pad, in the CSP package, stress caused by molding pressure will exert on the edge 201a of the chip 201 and the chip will crack at the edge 201a area. This will lower the yield for production.

Figure 6:
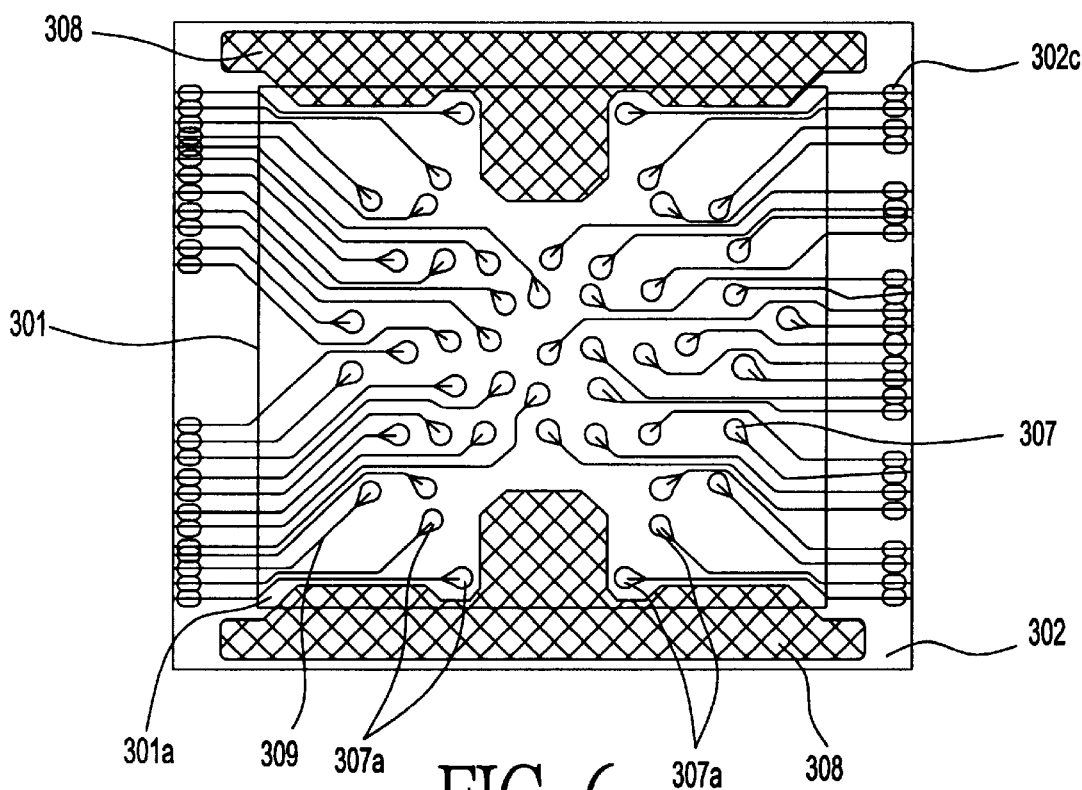
FIG. 6 is a top plan view of the substrate in accordance with a first embodiment of the present invention.

Referring FIG. 6, it illustrates a top plan view of the substrate 302 in accordance with the first embodiment of the present invention. The present invention shortens the length of outer traces 309 on the substrate 302 to move at least one outer via 307a outwardly to a location under the edge 301a of the chip 301 in a manner that the outer via 307a is not in line with other vias to form an offset via. Since the vias 307 are plated with copper, the offset via 307a might provide sufficient supporting strength for the chip edge 301a during molding process such that the die crack problem is eliminated. The offset via 307a is connected to the outmost bonding pad Preferably, the outer vias 307a form a staggered configuration. Further, the present invention also disposes a copper mesh 308 on the substrate 302 at the area without vias 307 and traces 309 so as to enhance the substrate strength for supporting the chip 301. When the chip 301 is mounted on the substrate 301, the copper mesh 308 lies under the edges 301a of the chip 301 for supporting the chip during molding process such that the die crack problem is eliminated.

Figure 7:
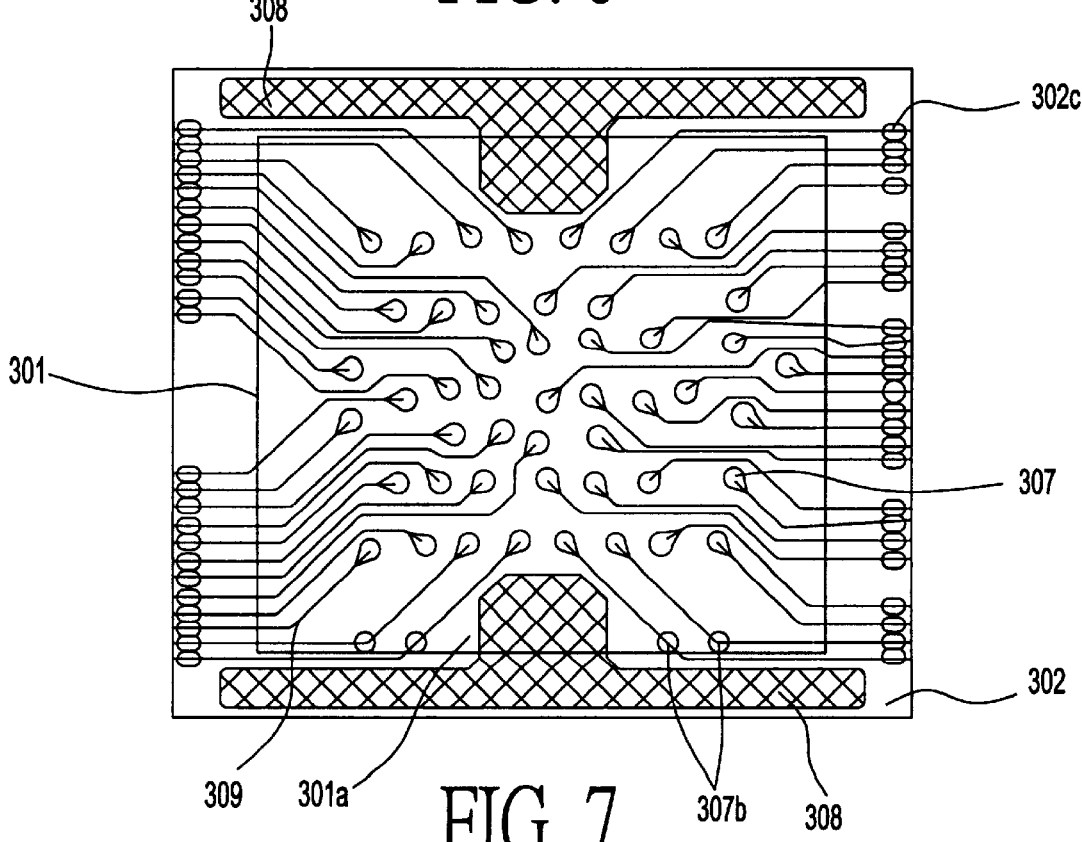
FIG. 7 is a top plan view of the substrate in accordance with a second embodiment of the present invention.

Referring FIG. 7, it illustrates a top plan view of the substrate 302 in accordance with the second embodiment of the present invention. The present invention further disposes dummy vias 307b on the outer traces 309 in the substrate 302 at the area under the chip edge 301a for supporting the chip. Dummy vias 307b are not connected to the solder ball pads 302f. Since the dummy vias 307b are plated with copper layer having sufficient supporting strength for the chip, the crack problem during molding process can be eliminated.

Although the invention has been explained in relation to its preferred embodiment, it is to be understood that many other possible modifications and variations can be made without departing from the spirit and scope of the invention as hereinafter claimed.

What is claimed is:

1. A semiconductor package comprising:
    a thin substrate having a dielectric layer, the thin substrate having a pair of longitudinal edges and a pair of lateral edges, the dielectric layer having an upper surface and lower surface;
    a plurality of bonding pads and traces disposed on the upper surface of the dielectric layer, the bonding pads locating along the longitudinal edges of the thin substrate and electrically connecting to the corresponding traces;
    a plurality of solder ball pads disposed at the lower surface of the dielectric layer;
    a plurality of vias, each connecting the solder ball pad to the corresponding bonding pad through the trace;
    a plurality of solder balls mounted on the solder ball pads for connecting to external circuits;
    a chip attached on the thin substrate, the chip having a pair of longitudinal edges and a pair of lateral edges, the chip having a plurality of chip pads electrically connected to the corresponding bonding pads, and
    a package body encapsulating the chip and the upper surface of the thin substrate;
    wherein the area surrounded by the solder balls is smaller than the area of the chip, at least one via is offset disposed under the lateral edge of the chip so as to be closer to the lateral edge, relative to adjacently arranged vias, for supporting the chip.

2. The semiconductor package as claimed in claim 1, wherein the offset via is connected to the outmost bonding pad.

3. The semiconductor package as claimed in claim 1, further comprising a copper mesh disposed under the lateral edge of the chip and on the substrate at the area without vias and traces so as to enhance the substrate strength for supporting the chip.

4. The semiconductor package as claimed in claim 1, wherein the thin substrate has a thickness no more than 0.36 mm.

5. The semiconductor package as claimed in claim 1, wherein outer vias form a staggered configuration.

6. A semiconductor package comprising:
   a thin substrate having a dielectric layer, the thin substrate having a pair of longitudinal edges and a pair of lateral edges, the dielectric layer having an upper surface and lower surface;
   a plurality of bonding pads and traces disposed on the upper surface of the dielectric layer, the bonding pads locating along the longitudinal edges of the thin substrate and electrically connecting to the corresponding traces;
   a plurality of solder ball pads disposed at the lower surface of the dielectric layer;
   a plurality of vias, each connecting the solder ball pad to the corresponding bonding pad through the trace;
   a plurality of solder balls mounted on the solder ball pads for connecting to external circuits;
   a chip attached on the thin substrate, the chip having a pair of longitudinal edges and a pair of lateral edges, the chip having a plurality of chip pads electrically connected to the corresponding bonding pads,
   a package body encapsulating the chip and the upper surface of the thin substrate; and
   at least one dummy via disposed at the trace under the lateral edge of the chip for supporting the chip.

7. The semiconductor package as claimed in claim 6, wherein the dummy via is connected to the outmost bonding pad.

8. The semiconductor package as claimed in claim 6, further comprising a copper mesh disposed under the lateral edge of the chip and on the substrate at the area without vias and traces so as to enhance the substrate strength for supporting the chip.

9. The semiconductor package as claimed in claim 6, wherein the thin substrate has a thickness no more than 0.36 mm.

10. The semiconductor package of claim 1, wherein said at least one offset via is closer to the lateral edge than an adjacent row of vias extending generally parallel to said lateral edge.

\* \* \* \* \*